United States Patent [19]
Waki et al.

[11] Patent Number: 5,530,292
[45] Date of Patent: Jun. 25, 1996

[54] SEMICONDUCTOR DEVICE HAVING A PLURALITY OF CHIPS

[75] Inventors: Masaki Waki, Sagamihara; Junichi Kasai, Kawasaki; Tsuyoshi Aoki, Sagamihara; Toshiyuki Honda; Hirotaka Sato, both of Kawasaki, all of Japan

[73] Assignee: Fujitsu Limited, Kawasaki, Japan

[21] Appl. No.: 961,171

[22] Filed: Oct. 16, 1992

Related U.S. Application Data

[63] Continuation-in-part of Ser. No. 778,993, filed as PCT/JP91/00348, Mar. 14, 1991, abandoned.

[30] Foreign Application Priority Data

Mar. 15, 1990 [JP] Japan ..................... 2-065123
Oct. 17, 1991 [JP] Japan ..................... 3-269644

[51] Int. Cl.⁶ ........................... H01L 23/02; H01L 25/04
[52] U.S. Cl. ................... 257/724; 257/777; 257/790; 257/793
[58] Field of Search ..................... 257/723, 790, 257/685, 734, 686, 724, 777, 793

[56] References Cited

FOREIGN PATENT DOCUMENTS

| | | | |
|---|---|---|---|
| 2360174 | 2/1978 | France | 257/723 |
| 54-128269 | 4/1979 | Japan | 257/723 |
| 54-83768 | 4/1979 | Japan | 257/723 |
| 54-150078 | 11/1979 | Japan | 257/685 |
| 56-17050 | 2/1981 | Japan | 257/723 |
| 56-63288 | 5/1981 | Japan | 257/723 |
| 56-62351 | 5/1981 | Japan | 257/723 |
| 56-137665 | 10/1981 | Japan | 257/723 |
| 58-10839 | 1/1983 | Japan | 257/723 |
| 58-67057 | 4/1983 | Japan | 257/723 |
| 60-4245 | 1/1985 | Japan | 257/723 |
| 60-28255 | 2/1985 | Japan . | |
| 60-98653 | 6/1985 | Japan . | |
| 61-32560 | 2/1986 | Japan . | |
| 61-50355 | 3/1986 | Japan . | |
| 61-79247 | 4/1986 | Japan | 257/723 |
| 62-73748 | 4/1987 | Japan | 257/723 |
| 63-211663 | 9/1988 | Japan . | |
| 64-1269 | 1/1989 | Japan . | |
| 64-22050 | 2/1989 | Japan . | |
| 1-184860 | 7/1989 | Japan | 257/685 |
| 2-63148 | 3/1990 | Japan | 257/790 |

OTHER PUBLICATIONS

*Patent Abstracts of Japan*, vol. 012, No. 207 (E–621), Jun. 14, 1988 (JP 63–4636).
*Patent Abstracts of Japan*, vol. 014, No. 564 (E–101), Dec. 14, 1990 (JP 2–246128).
*Patent Abstracts of Japan*, vol. 013, No. 470 (E–835), Oct. 24, 1989 (JP 1–184860).
*Patent Abstracts of Japan*, vol. 014, No. 082 (E–0889), Feb. 15, 1990 (JP 1–293556).
*Patent Abstracts of Japan*, vol. 006, No. 016 (E–092), Jan. 29, 1982 (JP 56–137665).
*Patent Abstracts of Japan*, vol. 013, No. 298 (E–784), Jul. 10, 1989 (JP 1–77136).
"Stacked Tab Chip Carrier", *IBM Technical Disclosure Bulletin*, vol. 33, No. 6A, Nov. 1990, Armonk, NY, US.
*Patent Abstracts of Japan*, vol. 12, No. 225 (E–626), Jun. 25, 1988 and JP A–63–18654 (Hitachi Micro Comput. Engl Ltd) Jan. 26, 1988.
*Patent Abstracts of Japan*, vol. 13, No. 298 (E–784), Jul. 10, 1989 (JP A–1–77135).
*Patent Abstracts of Japan*, vol. 13, No. 483 (E–839), Nov. 2, 1989 (JP A–1–191462).
*Patent Abstracts of Japan*, vol. 14, No. 99 (E–089), Feb. 22, 1990 (JP A–1–303730).

*Primary Examiner*—Donald L. Monin, Jr.
*Attorney, Agent, or Firm*—Staas & Halsey

[57] ABSTRACT

Two semiconductor chips are coupled to outer leads by means of tape leads so that the chips are spaced apart from each other. A space between the chips is filled with a mold resin.

7 Claims, 13 Drawing Sheets

SEMICONDUCTOR DEVICE HAVING A PLURALITY OF CHIPS

CROSS-REFERENCE TO RELATED APPLICATION

This application is a continuation-in-part of application No. 778,993, filed as PCT/JP91/00348, Mar. 14, 1991, now abandoned.

BACKGROUND OF THE INVENTION

1. Field of the Invention

The present invention relates to semiconductor devices, and more particularly to high-mounting density semiconductor devices which utilize TAB (Tape Automated Bonding).

2. Description of the Prior Art

FIGS. 1A and 1B respectively show typical examples based on conventional mounting schemes. Referring to FIG. 1A, a semiconductor chip 12 is die-bonded on a die stage 11 of a lead frame, and then bonding pads formed on a chip face of the semiconductor chip 12 and outer leads 14 of the lead frame are wire-bonded together by bonding wirings 13. The bonding is carried out by a thermocompression bonding procedure during which ends of the bonding wires which have been heated are placed on members which are to be bonded. According to the above wire bonding procedure, it becomes possible to automatically connect the semiconductor chip 12 and the lead frame 14. During the wire bonding procedure, the bonding pads are processed in series.

FIG. 1B shows a TAB-based mounting structure. A plurality of parts which are to be bonded are prepared on the chip face of the semiconductor chip 12. Tape leads 17, each having a plurality of corresponding leads, are arranged on the parts on the chip face. By using bumps 16, a thermocompression bonding procedure is carried out so that the tape leads 17 are bonded to the parts via the bumps 16 at one time. After the bonding procedure on the semiconductor chip 12 and the tape leads 17 is carried out, a positioning procedure on the tape leads 17 and the outer leads 14 is carried out. Hence, the tape leads 17 and the outer leads 14 are bonded together in such a manner that plating layers of the tape leads 17 and the outer leads 14 form eutectic crystals. It is possible to provide the bumps 16 on the bonding pads of the semiconductor chip 12 or provide the bumps 16 on the end portions of the tape leads 17.

By using the TAB procedure, it becomes possible to execute a bonding procedure on a plurality of bonding parts at one time. As compared with the bonding wires 13, it is easy to fine produce the tape leads 17. For these reasons, the TAB procedure can satisfy recent requirements of increase in the number of pins and increase in the integration density.

A resin molded semiconductor device can be produced by sealing a bonded assembly with a molded resin.

The feature scale of pattern is being reduced. However, there are limits upon the number of pins and the integration density while the shapes of packages being used at present are maintained. The conventional package structures have limits upon an increase in the integration density arising from a package size, that is, an internal space of the package.

The conventional mounting techniques for increasing the number of pins and the integration density by reducing wiring patterns and the pitch of electrodes are indented to improvement in the density in the two-dimensional area.

Recently, semiconductor devices having a plurality of semiconductor chips provided inside a package have been proposed. For example, Japanese Laid-Open Patent Publication No. 56-17050 shows a semiconductor device in which semiconductor chips are mounted on both sides of a supporting base and the semiconductor chips are connected to the lead frames by bonding wires. After bonding, the semiconductor chips are sealed by a mold resin.

Japanese Laid-Open Patent Publication No. 56-137665 discloses a semiconductor device in which at least two pellets are disposed on both sides of lead frames and electrode parts of the pellets are bonded to the lead frames (by soldering bumps). After bonding, the pellets are sealed by molding.

Further, "NIKKEI MICRODEVICES", November, 1989, discloses a structure in which four LSI chips, each being sealed by molding, are successively stacked in order to improve the integration density per area.

However, the semiconductor device disclosed in Japanese Laid-Open Patent Publication No. 56-17050 has the following disadvantages. First, it is impossible to considerably reduce the distance (pitch) between adjacent pins because the wire bonding is used. Second, it is necessary to bend the bonding wires (see FIG. 1A), and it is difficult to produce a thin structure because of use of the supporting base.

The semiconductor device disclosed in Japanese Laid-Open Patent Publication No. 56-137665 has the following disadvantages. In light of production process, it is difficult to directly adhere the semiconductor chip on the lead frames by means of soldering bumps. Particularly, it is very difficult to precisely attach a semiconductor chip to the lead frames to which another semiconductor chip has been attached. If an positional error occurs, the semiconductor chips may be exposed from the molded resin.

The structure disclosed in "NIKKEI MICRODEVICES" has a first disadvantage in that a thin structure cannot be produced because the four molded LSI chips are successively stacked and a second disadvantage in that a complex step is needed to adhere the four LSI chips.

SUMMARY OF THE INVENTION

An object of the present invention is to provide a semiconductor device in which the above disadvantages are eliminated.

A more specific object of the present invention is to provide a semiconductor device in which a plurality of semiconductor chips are bonded via tape leads.

The above objects of the present invention are achieved by a device comprising: lead frames respectively having first main surfaces and second main surfaces opposite to each other, bonding being able to be performed on the first and second main surfaces; a first semiconductor chip arranged on first main surface sides of the lead frames; first tape leads electrically connecting the first main surfaces of the lead frames to the first semiconductor chip; a second semiconductor chip arranged on second main surface sides of the lead frames; second tape leads electrically connecting the second main surfaces of the lead frames to the second semiconductor chip; and a mold resin molding the first and second semiconductor chips. The first semiconductor chip has a first surface including an internal circuit, and a second surface opposite to the first surface. The second semiconductor chip has a first surface including an internal circuit, and a second surface opposite to the first surface of the second semiconductor chip. The second surface of the first semiconductor chip is opposed to the second surface of the second semiconductor chip. The mold resin is provided in a space between the second surfaces of the first and second semiconductor chips.

The above-mentioned objects of the present invention are also achieved by a semiconductor device comprising: first and second semiconductor chips forming a first pair; third and fourth semiconductor chips forming a second pair; a plurality of lead frames respectively having first and second main surfaces, the first and second pairs being located on respective sides of the lead frames so that the first and second pairs are opposite to each other; first tape leads electrically connecting the first main surfaces of the lead frames to the first semiconductor chip; second tape leads electrically connecting the first main surfaces of the lead frames to the second semiconductor chip; third tape leads electrically connecting the second main surfaces of the lead frames to the third semiconductor chip; fourth tape leads electrically connecting the second main surfaces of the lead frames to the fourth semiconductor chip; and a mold resin molding the first, second, third and fourth semiconductor chips. The mold resin is provided in a first space between the first and second semiconductor chips and a second space between the third and fourth semiconductor chips.

BRIEF DESCRIPTION OF THE DRAWINGS

Other objects, features and advantages of the present invention will become more apparent from the following detailed description in conjunction with the accompanying drawings, in which.

BEST MODE OF CARRYING OUT THE INVENTION

Figure 1A:
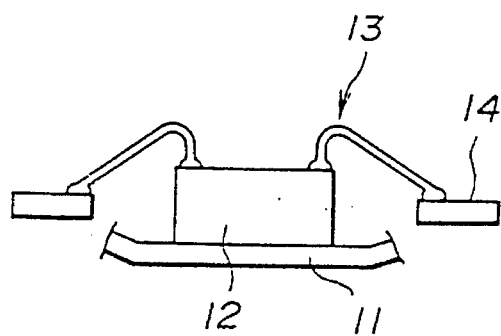
FIG. 1A is a cross-sectional view of a conventional semiconductor device.
Figure 1B:
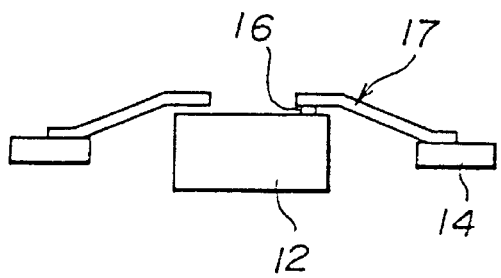
FIG. 1B is a cross-sectional view of another conventional semiconductor device.
Figure 2:
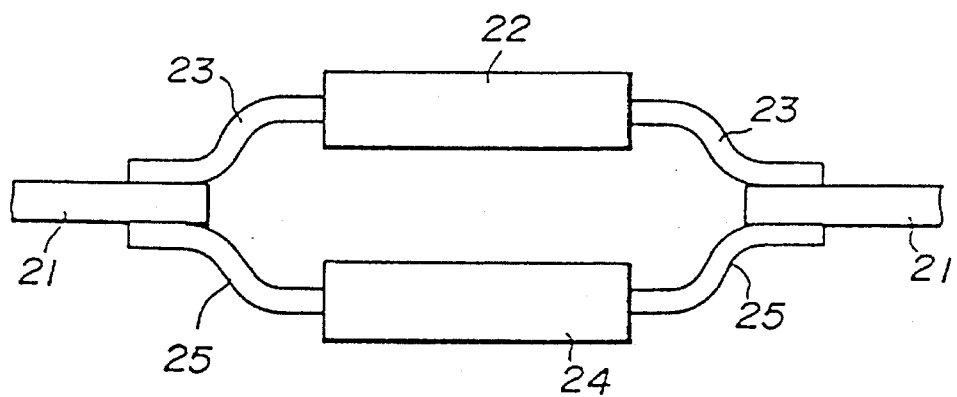
FIG. 2 is a cross-sectional view showing an outline of the present invention.

FIG. 2 is a diagram showing the outline of the present invention. According to the present invention, semiconductor chips are mounted on both surfaces of a lead frame by using TAB.

Referring to FIG. 2, lead frames 21 have first main surfaces (for example, upper surfaces) and second main surfaces (for example, lower surfaces). Tape leads can be bonded to both the surfaces of the lead frame 21. A first semiconductor chip 22 is arranged on the upper sides of the lead frames 21, and the first main surfaces of the lead frames 21 are electrically connected to the first semiconductor chip 22 via first tape leads 23. A second semiconductor chip 24 is arranged on the lower side of the lead frames 21. The second main surfaces of the lead frames 21 are electrically connected to the second semiconductor chip 24 by second tape leads 25.

It becomes possible to provide a plurality of semiconductor chips on both sides of the lead frames 21 in the following manners. The lead frames 21 are formed so that the first and second main surfaces thereof can be bonded. The first semiconductor chip 22 is arranged on the sides of the first main surfaces of the lead frames 21, and connected to the first main surfaces of the lead frames 21 by the first tape leads 23. The second semiconductor 24 is arranged on the sides of the second main surfaces of the lead frames 21, and connected to the second main surfaces of the lead frames by the second tape leads 25.

The semiconductor chips 22 and 24 can be selectively activated by using, for example, a chip select signal. In this case, there is not any problem arising from the arrangement in which the first tape leads 23 and the second tape leads 25 are connected to both the sides of the same lead frames. Since a plurality of semiconductor chips can be accommodated on an identical area, it becomes possible to double the mounting efficiency. It is not necessary to greatly modify production facilities in order to fabricate the present invention because the structure as shown in FIG. 2 can be obtained by repeatedly executing tape automated bonding with respect to the lead frames.

Figure 3A:
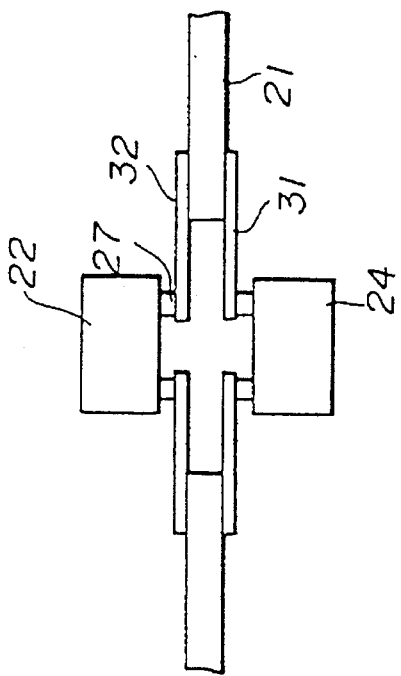
FIG. 3A is a cross-sectional view of a first embodiment of the present invention.

FIG. 3A is a diagram showing the first embodiment of the present invention. In FIG. 3A, the first semiconductor chip 22 is arranged on the upper sides of the lead frames 21, and the second semiconductor chip 24 is arranged on the lower sides thereof. Bent tape leads 29 electrically connect the first semiconductor chip 22 to the upper surfaces of the lead frames 21, and bent tape leads 30 electrically connect the second semiconductor chip 24 to the lower surfaces of the lead frames 21. The semiconductor chips 22 and 24 are connected to the tape leads 29 and 30 by bumps 27, which are made of gold (Au) and formed on Al wiring layers on the semiconductor chips 22 and 24.

Figure 4A:
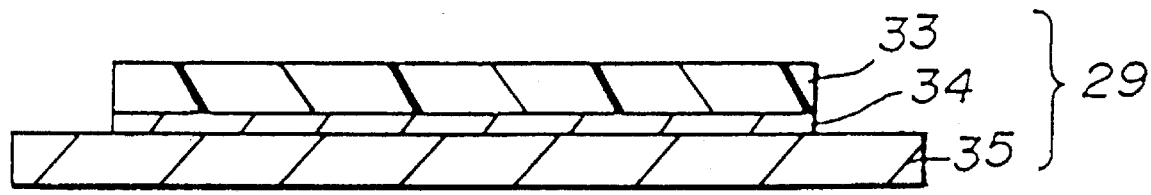
FIG. 4A is a cross-sectional view of a tape lead used in the embodiments of the present invention.
Figure 4B:
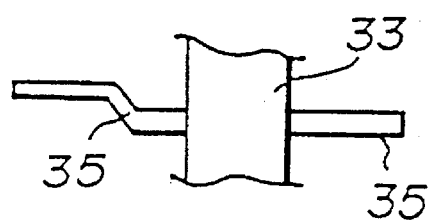
FIG. 4B is a plan view of the tape lead shown in FIG. 4A.

The tape leads 29 have a structure as shown in FIG. 4A or FIG. 4B. A copper leaf pattern 35 having a thickness of approximately 30 μm is adhered to a polyimide tape 33 having a thickness of approximately 125 μm by means of an insulating adhesive 34. Both ends of the copper leaf pattern 35 project from the polyimide tape 33. This structure facilitates bonding. First, a three-layer structure composed of the layers 33, 34 and 35 is formed. Second, the copper leaf 35 is patterned. Third, the polyimide tape 33 is patterned so that the end portions of the leads project therefrom. The patterned polyimide tape 33 supports the tape lead 29 so that the tape lead 29 is prevented from being deformed. The copper leaf pattern 35 includes a tin (Sn) plating layer having a thickness of about 0.5 μm on its surface portion. The copper leaf pattern 35 includes a plurality of leads, each of which has a shape as shown in FIG. 4B. Each lead is formed so that it has a lead portion 35 having a length of about 70 μm on the side of the semiconductor chip and a lead portion 35 having a length of 100 μm on the side of the lead frame 21. An intermediate portion between both the extensions is formed of a thinner wiring portion. Hereinafter, a portion of the lead portion (copper leaf pattern) 35 which is connected to the semiconductor chip is referred to as an inner lead, and a portion of the lead portion 35 which is connected to the lead frame 21 is referred to as an outer lead.

The above-mentioned tape lead is a three-layer tape lead. It is also possible to use a two-layer tape lead which does not have the insulating adhesive 34 or a single-layer tape lead consisting of only a conductive pattern. It is also possible to form bumps on the tape leads instead of the formation of bumps on the semiconductor chips.

Figure 5:
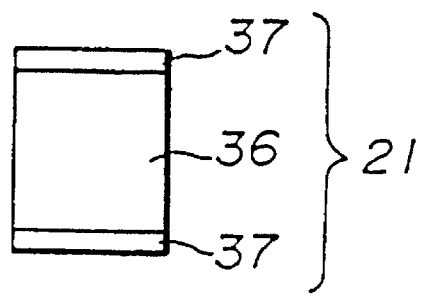
FIG. 5 is a cross-sectional view of a lead frame used in the embodiment of the present invention.

The lead frames have a cross-sectional structure, as shown in FIG. 5. In this figure, the lead frame 21 is composed of a lead frame base 36 made of an iron-system alloy, and plating layers formed on opposed surfaces of the base 36 and made of gold (Au), silver (Ag) or the like. Since the lead frame 21 has the plating layers on the opposed surfaces of the base 36, it is possible to perform bonding on both the surfaces of the base 36. When the surface of the lead portion 35 of the tape lead 29 is plated with Sn and the lead frame 21 has the plating layers 37 on both the surfaces thereof, the tape lead 29 and the lead frame 21 form an eutectic crystal by thermocompression, so that bonding can be made.

It is not necessary to form the plating layers on portions of the tape lead 29 and the lead frames which will not be bonded.

In order to stably maintain the semiconductor chips 22 and 24 in the structure shown in FIG. 3A, it is preferable that back surfaces of the semiconductor chips 22 and 24 be fixed to each other by an adhesive, such as silver paste. When the above-mentioned assembly is sealed by molding, the adhesive layer functions to provisionally fix the semiconductor chips 22 and 24. If the adhesive layer 28 is not used, the two semiconductor chips 22 and 24 will be displaced during the mold sealing process, and will be partially exposed from the molded resin. This displacement causes a stress concentration on some of the bumps 27, and the tape leads 29 may come off from the semiconductor chips 22 and 24. The adhesive layer 28 may be an insulating adhesive, such as an epoxy-system adhesive instead of the above-mentioned conductive adhesive, such as silver paste.

In the structure shown in FIG. 3A, as will be described later, the first tape leads 29 and the second tape leads 30 are simultaneously bent during a cutting process using a die, so that the semiconductor chips are maintained in a state where they float on opposed sides of the lead frames.

If tape automated bonding is carried out for the structure shown in FIG. 3A without bending the tape leads, the semiconductor chips 22 and 24 will come into contact with each other, and corners thereof may be shortcircuited. Further, a stress is exerted on contact portions where the lead frames 21 are in contact with the tape leads 29 and 30 in a direction in which the tape leads 29 and 30 are detached from the lead frames 21. Hence, there is a possibility that the tape leads 29 and 30 may come off from the tape leads 29 and 30 for long-term use. This degrades reliability of the semiconductor device.

The structure shown in FIG. 3A has upper and lower portions which are symmetrical with each other with respect to the center portion of the lead frames 21. It is preferable that the arrangement patterns of terminals (pads) formed on the semiconductor chips 22 and 24 have a mirror symmetry relationship if the semiconductor chips 22 and 24 are designed to have identical functions.

Figure 6:
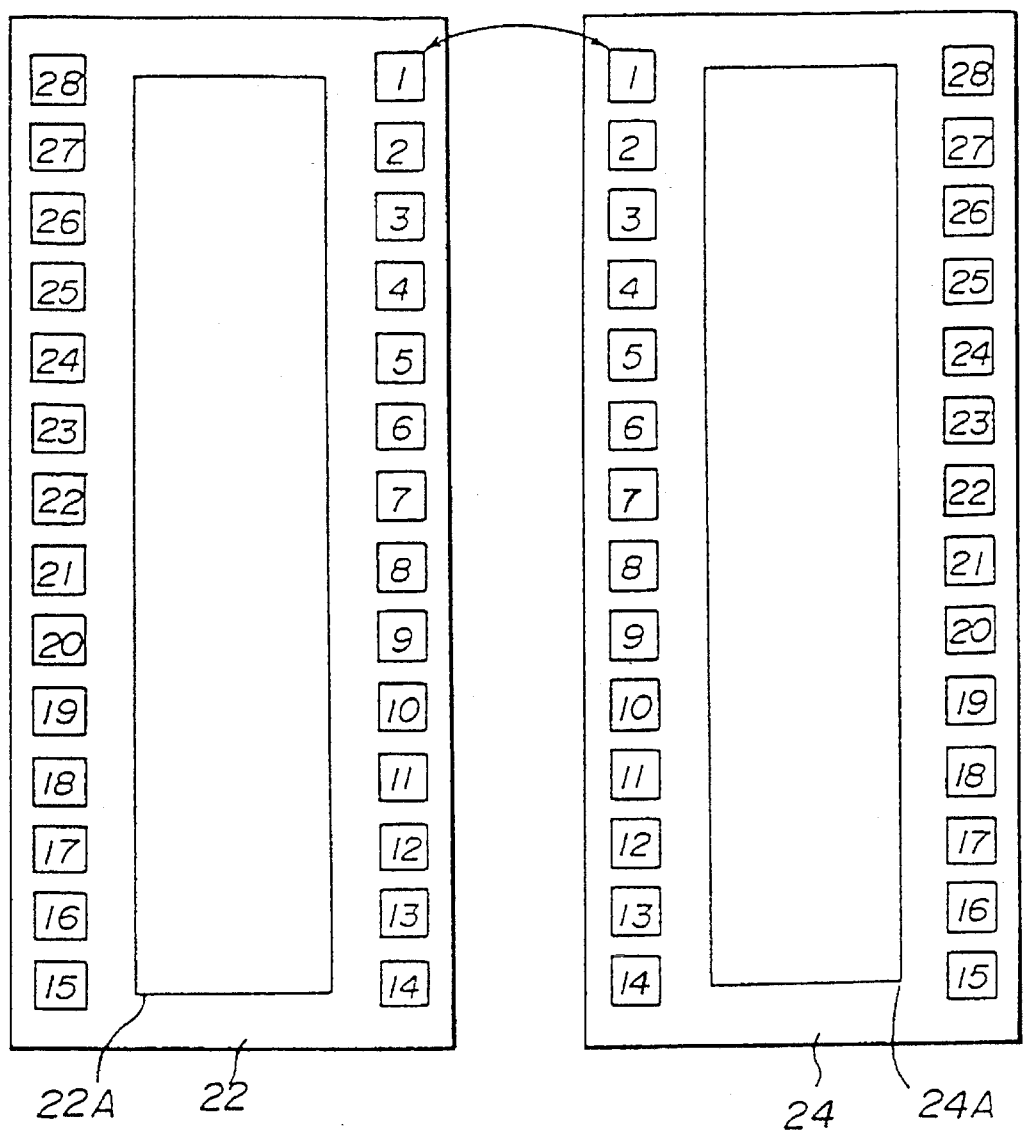
FIG. 6 is a diagram showing a mirror symmetry relationship between terminal arrangements which can be employed in the first through third embodiments of the present invention.

FIG. 6 is a diagram of the arrangements of terminals formed on the semiconductor chips 22 and 24. A reference 22A indicates an internal circuit of the semiconductor chip 22, and a reference 24A indicates an internal circuit of the semiconductor chip 24. That is, FIG. 6 shows the semiconductor chip 22 viewed from the upper side thereof and the semiconductor chip 24 viewed from the lower side thereof. Terminals "1" of the semiconductor chips 22 and 24 are coupled to the same lead frame 21 via the tape leads 29 and 30. The same terminal numbers of the semiconductor chips 22 and 24 have the same functions and transfer the same signals. As shown, the terminal patterns of the semiconductor chips 22 and 24 are determined so that when both the semiconductor chips overlap with each other, the terminals having the same functions are connected to the same lead frames (mirror symmetry). When the mirror symmetry relationship is employed, it is preferable that the internal circuits 22A and 24A have the mirror symmetry relationship in light of the production process. In this case, different masks having the mirror symmetry relationship are used. However, the internal circuit 22A may be asymmetrical with the internal circuit 24A. The internal circuits 22A and 24A may also have symmetrical parts and asymmetrical parts.

Figure 7:
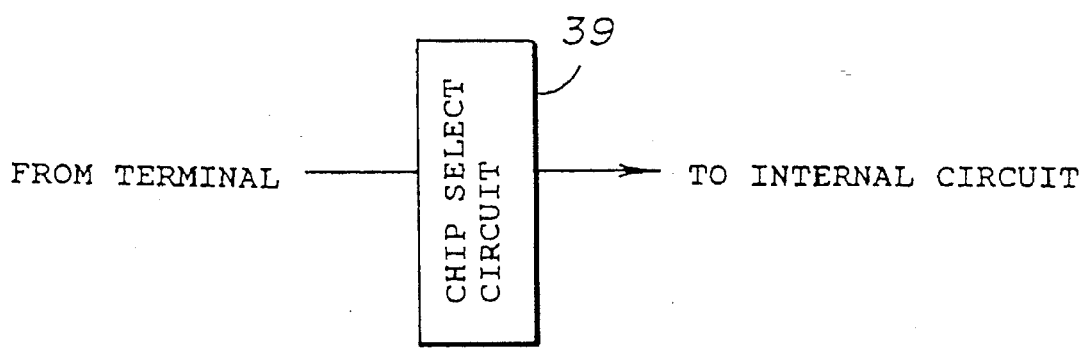
FIG. 7 is a block diagram of a chip select circuit provided in a semiconductor chip in each of the first, second and third embodiments of the present invention.

Use of the terminal patterns having the mirror symmetry relationship is suitable for the case where the semiconductor chips 22 and 24 have the same functions (for example, memories). Since signals are supplied to the semiconductor chips 22 and 24 via the terminals in the structure shown in FIG. 6, it is necessary to select either the semiconductor chip 22 or the semiconductor chip 24. For this purpose, a chip select circuit 39 shown in FIG. 7 is provided in each of the semiconductor chips 22 and 24. An input terminal of the chip select circuit 39 is connected to one of the terminals (chip select terminal), and an output terminal thereof is connected to the internal circuit 22A or 24A. The chip select circuit 39 provided in the semiconductor chip 22 and the chip select circuit 39 provided in the semiconductor chip 24 operate by different logics. For example, the chip select circuit 39 of the semiconductor chip 22 outputs a high-level output signal to the internal circuit 22A when receiving a high-level signal (chip select signal) from an external device via the chip select terminal, so that the internal circuit 22A is activated. When the level of the chip select signal is low, the chip select circuit 39 of the internal circuit 22A is made inactive. The chip select circuit 39 of the semiconductor chip 24 outputs a low-level output signal to the internal circuit 24A when receiving the high-level signal via the chip select terminal, so that the internal circuit 24A is made inactive. When the chip select signal is at the low level, the chip select circuit 39 of the semiconductor chip 24 outputs the high-level signal, which activates the internal circuit 24A. In this manner, either the semiconductor chip 22 or the semiconductor chip 24 can be selected.

FIG. 6 shows a DIP arrangement, but other terminal arrangements can be configured in the same manner as described above. It is possible to connect the chip select terminals to a lead frame in common and arrange the other terminals in the mirror asymmetry. In this case, peripheral circuits of the semiconductor chips 22 and 24 may be complex.

The structure shown in FIG. 3A is sealed by molding of resin. The first and second semiconductor chips 22 and 24 equipped with the bumps 27 are arranged on both sides of the lead frames 21 and connected thereto via the bent tape leads 29 and 30 in the same manner as those shown in FIG. 3A. The structure having the semiconductor chips which have been bonded to the lead frames 21 are sealed by transfer molding of resin 38, such as an epoxy resin, so that a resin molded semiconductor device is configured. As has been described previously, it is preferable that the adhesive layer 28 be provided between the semiconductor chips 22 and 24, as shown in FIG. 3A.

A description will now be given of a production process of the semiconductor device shown in FIG. 8 with reference to FIGS. 9A through 9E, in which those parts which are the same as those shown in the previous figures are given the same reference numerals. As shown in FIG. 9A, inner portions of tape leads 41 respectively extending from two tapes 40 are positioned on the bumps 27 formed on the semiconductor chip 24, and bonded at a temperature of approximately 500° C. by using a tool (thermode) 42.

Figure 9A:
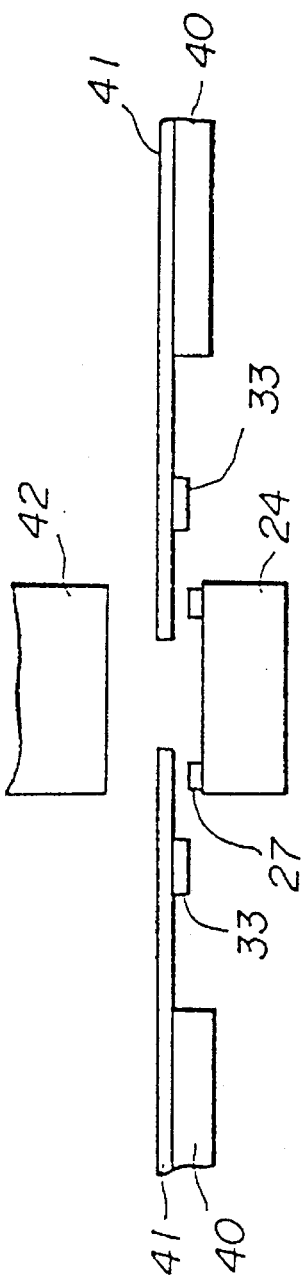
FIGS. 9A, 9B, 9C, 9D and 9E are diagrams of steps to product the semiconductor device according to the first embodiment of the present invention.
Figure 9B:
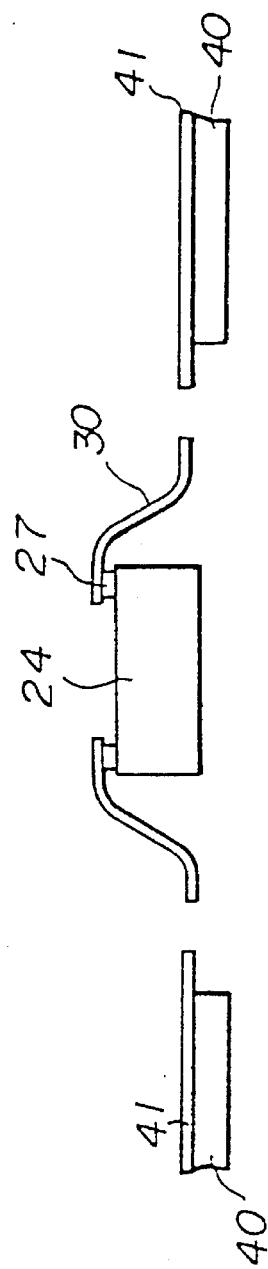

Next, as shown in FIG. 9B, the tape leads 41 are cut outside the polyimide tapes 33 (which are omitted in FIGS. 9B–9E) and bent by using the die. Thereby, the tape leads 30 connected to the bumps 27 are formed.

Figure 9C:
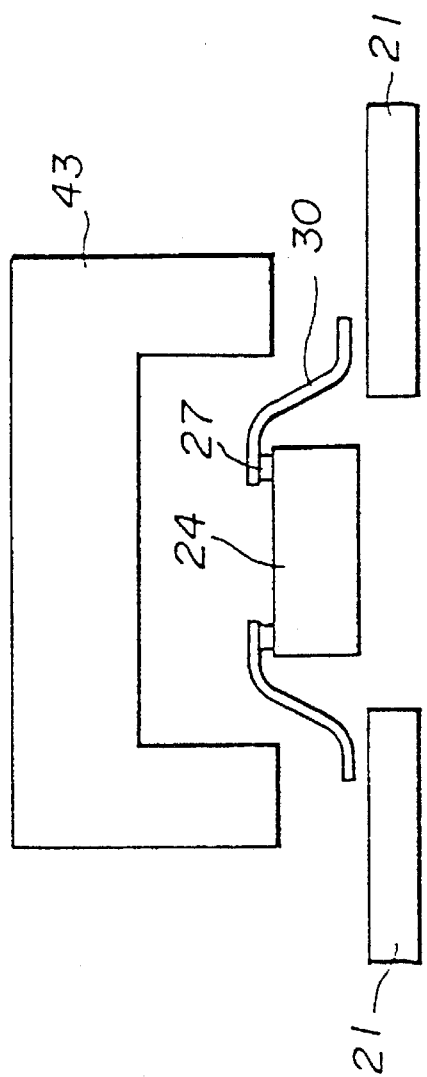

Then, as shown in FIG. 9C, the lead frames 21 are placed close to the corresponding tape leads 30, and bonded thereto at a temperature of about 450° C. by using a bonding tool 43.

Figure 9D:
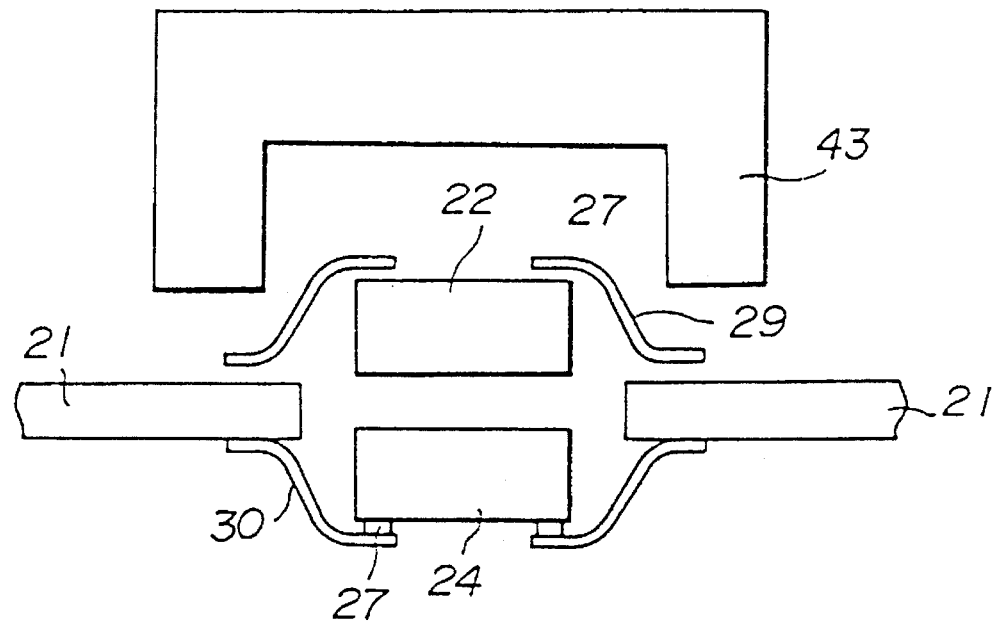

As shown in FIG. 9D, the semiconductor chip 22 obtained by the steps shown in FIGS. 9A and 9B is positioned so that it faces the semiconductor chip 24, and is bonded thereto at a temperature of about 450° C. by using the bonding tool 43 in the same way as shown in FIG. 9C.

Figure 9E:
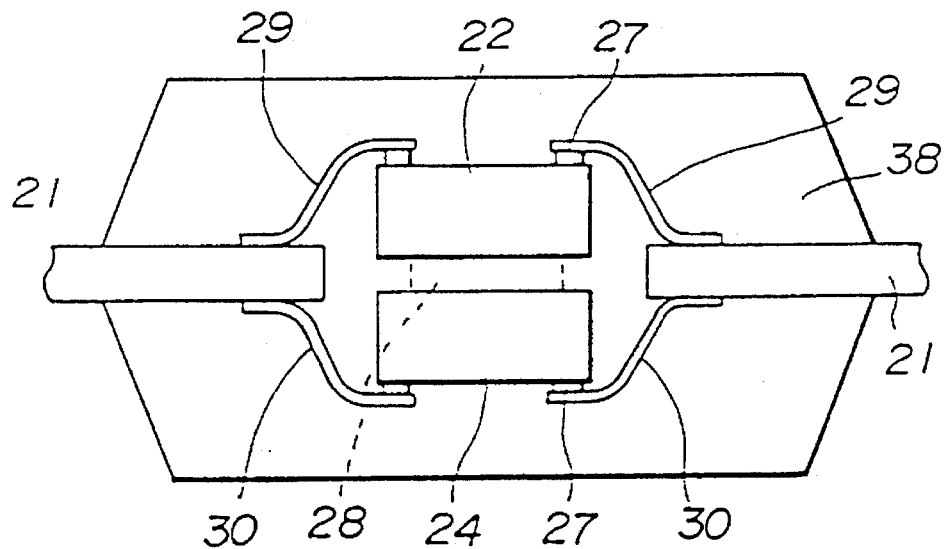

Finally, as shown in FIG. 9E, the assembly is sealed by molded resin 38.

Figure 3C:
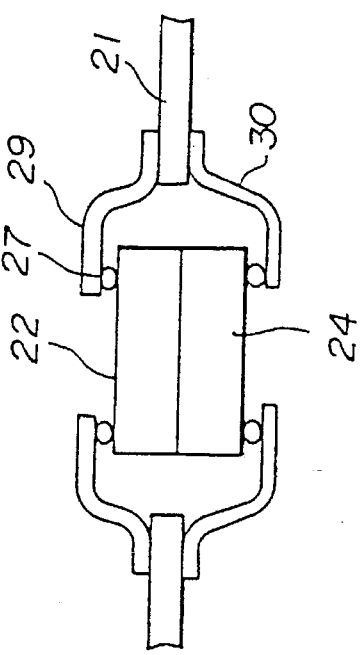
FIG. 3C is a cross-sectional view of a third embodiment of the present invention.
Figure 3B:
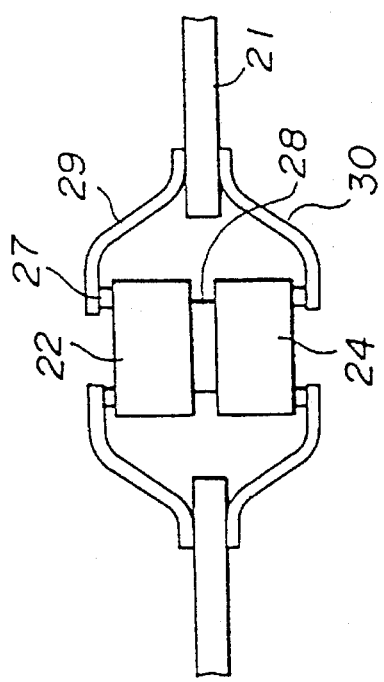
FIG. 3B is a cross-sectional view of a second embodiment of the present invention.
Figure 3D:
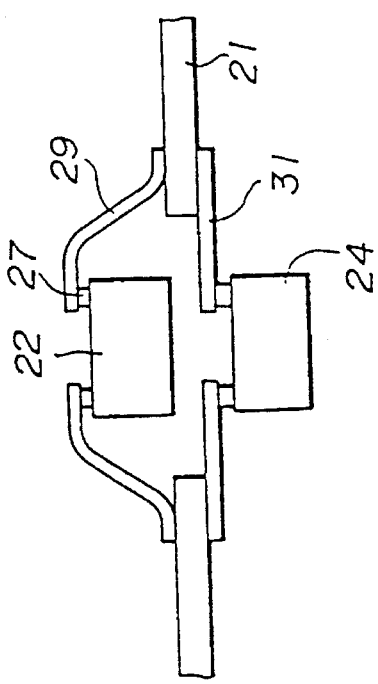
FIG. 3D is a cross-sectional view of a fourth embodiment of the present invention.

FIG. 3D shows a variation of the structure shown in FIG. 3A. As shown, a back surface of the first semiconductor chip 22 sticks to a back surface of the semiconductor chip 24 without the adhesive layer 28. If there is no problem regarding electrical insulation, the structure shown in FIG. 3D can be used.

A description will now be given of a second embodiment of the present invention with reference to FIG. 3B. The structure shown in FIG. 3B is asymmetrical with respect to the upper and lower sides of the lead frames 21. The structure shown in FIG. 3B has an upper portion which is almost the same as that of the structure shown in FIG. 3A. The tape leads 29 are so bent that a bottom surface of the semiconductor chip 22 is positioned above a central surface of the lead frames 21. The tape leads 31 connected to the lower surfaces of the lead frames 21 are not bent, but straight. If the semiconductor chip 24 is bonded to the upper sides of the tape leads 31, the two semiconductor chips will come into contact with each other. In the structure shown in FIG. 3B, the semiconductor chip 24 is bonded to the lower surfaces of the straight tape leads 31. The semiconductor chip 22 is arranged on the upper sides of the central surfaces of the lead frames 21 and the semiconductor chip 24 is arranged on the lower sides thereof. This arrangement is the same as that shown in FIG. 3A, and hence there is no physical interference between both the semiconductor chips. In the structure shown in FIG. 3B, chip faces of the semiconductor chips 22 and 24 are oriented in the same direction. Hence, it is possible to use two completely identical semiconductor chips.

FIG. 3C shows a third embodiment of the present invention in which the semiconductor chips 22 and 24 are mounted on both sides of the lead frames 21 by means of two straight tape leads 31 and 32. That is, the two semiconductor chips 22 and 24 are arranged on upper sides of the tape leads 32 and 31, respectively. The tape leads 31 and 32 are spaced apart from each other at a distance approximately equal to the thickness of the lead frame 21. In the structure shown in FIG. 3C, there is no need to bend the tape leads. It is preferable that the semiconductor chips 22 and 24 have the mirror symmetry arrangements of terminals in the same manner as shown in FIG. 3A.

It is possible to selectively employ the above-mentioned three basic structures taking into account application thereof.

A description will now be given of a fourth embodiment of the present invention with reference to FIG. 10. The fourth embodiment is a semiconductor device in which three or more semiconductor chips are stacked in a single package. The semiconductor device shown in FIG. 10 has four semiconductor chips 52a, 52b, 54a and 54b. The semiconductor chips 52a and 52b are supported on upper lead frames 60 which are bent, and the semiconductor chips 54a and 54b are supported on lower lead frames 62 which are bent. Tape leads 56a, which are bent and connected to the bumps 57 on the semiconductor chip 52a, are bonded to upper end portions of the upper lead frames 60. Tape leads 56b, which are bent and connected to the bumps 57 on the semiconductor chip 52b (its back surface is opposed to the back surface of the semiconductor chip 52a), are bonded to lower end portions of the upper lead frames 60. A chip face of the semiconductor chip 54a (a face through which an internal circuit is exposed) is opposed to that of the semiconductor chip 52b. Bent tape leads 58a bonded to the bumps 57 of the semiconductor chip 54a are bonded to upper end portions of the lower lead frames 62. Bent tape leads 58b bonded to the bumps 57 of the semiconductor chip 54b are bonded to lower end portions of the lower lead frames 62. The back surface of the semiconductor chip 54a is opposite to the back surface of the semiconductor chip 54b. It is preferable that the aforementioned adhesive layers 28 (FIG. 3A) be interposed between the semiconductor chips 52a and 52b and between the semiconductor chips 54a and 54b. It is possible to provide the adhesive layer 28 between the semiconductor chips 52b and 54a. One upper lead frame 60 and one lower lead frame 62 are bonded together, so that a single lead frame is formed. It is possible to bond (stack) the lead frames 60 and 62 when the assembly is sealed by a molded resin 64.

Figure 10:
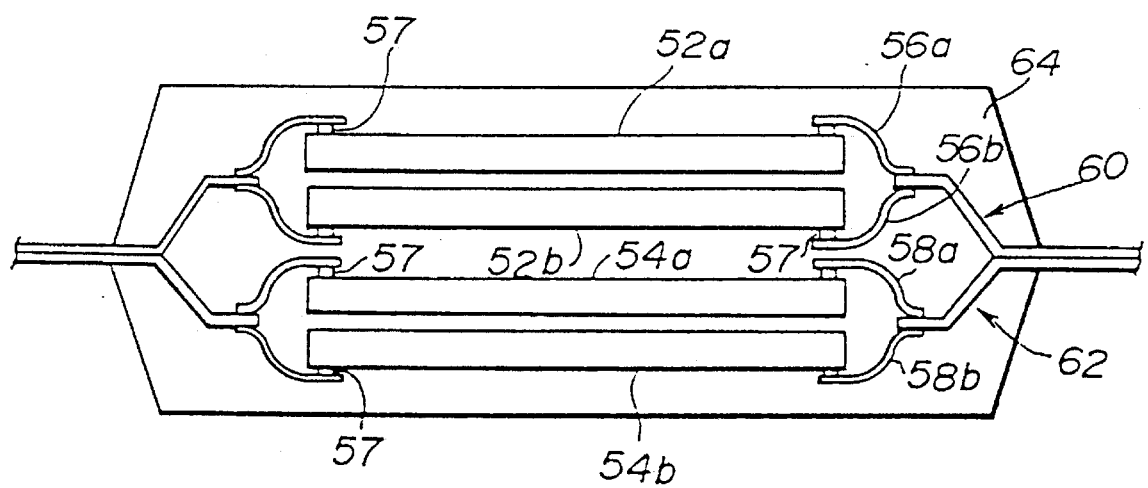
FIG. 10 is a cross-sectional view of a semiconductor device according to a fourth preferred embodiment of the present invention.
Figure 11A:
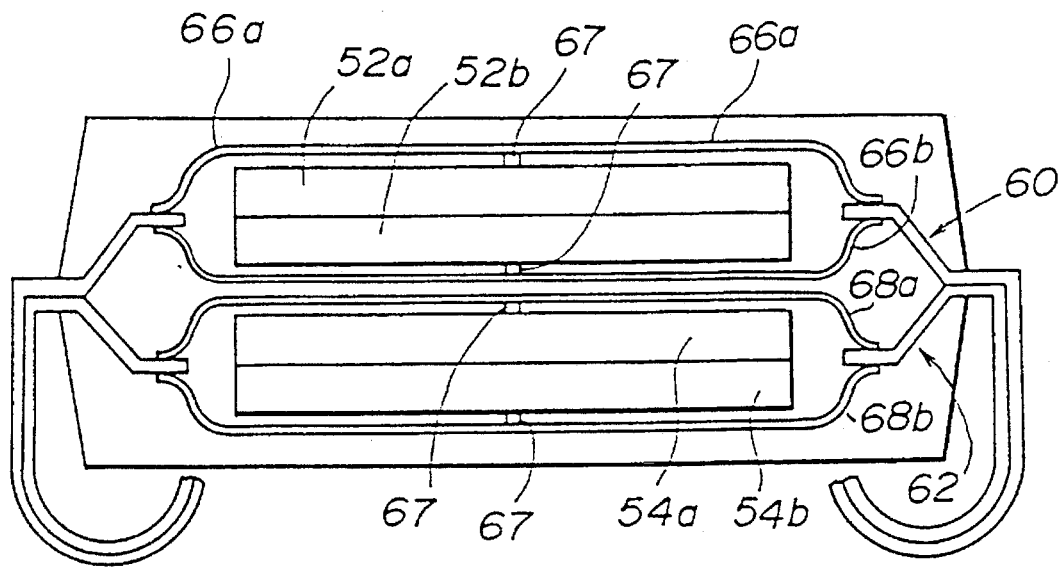
FIG. 11A is a cross-sectional view of a variation of the fourth embodiment shown in FIG. 10.
Figure 11B:
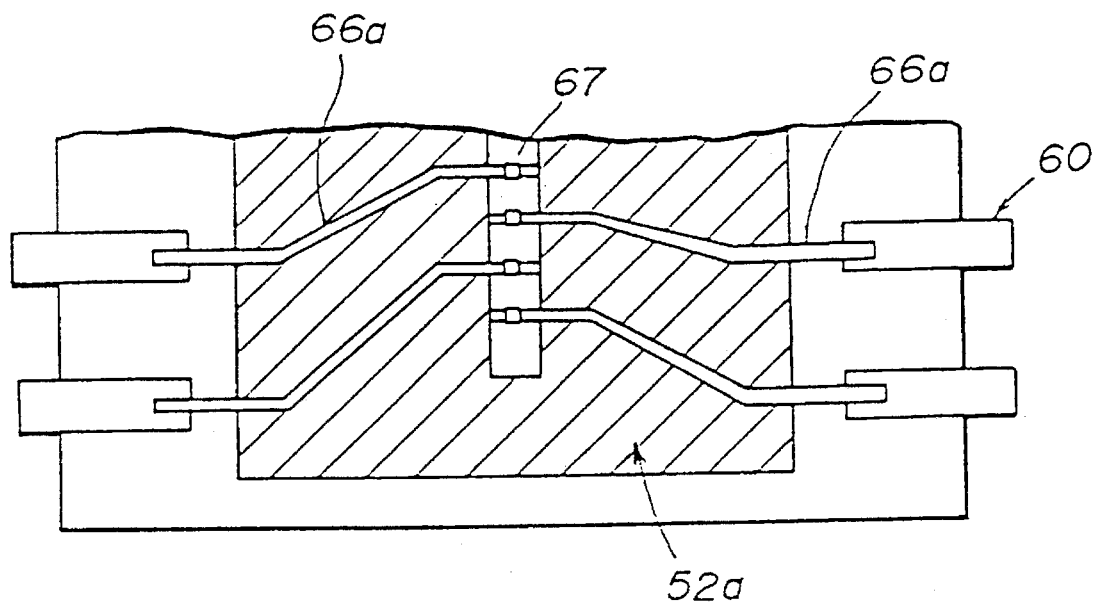
FIG. 11B is a plan view of a part of the variation of the semiconductor device shown in FIG. 11A.

FIG. 11A is a cross-sectional view of a variation of the fourth embodiment of the present invention shown in FIG. 10, and FIG. 11B is a plan view of a part of this variation. The back surfaces of the semiconductor chips 52a and 52b are in contact with each other, and the back surfaces of the semiconductor chips 54a and 54b are in contact with each other. A plurality of bumps 67 arranged in a line are formed on each of the main surfaces of the semiconductor chips 52a, 52b, 54a and 54b. Each of tape leads 66a bonded to the upper end portions of the upper lead frames 60 is connected to one of the bumps 67. In the structure shown in FIG. 11B, the tape leads 66a on the right side and the tape leads 66a on the left side are alternately arranged and connected to the bumps 67. Similarly, tape leads 66b, 68a and 68b are connected to the bumps 67 formed on the semiconductor chips 52b, 54a and 54b, respectively. The end portions of the integrated lead frames 60 and 62 are bent inwardly. Each of the semiconductor chips 52a, 52b, 54a and 54b is a 16 Mbit DRAM, and hence the device shown in FIG.11A functions as a 64 Mbit DRAM.

Figure 12A:
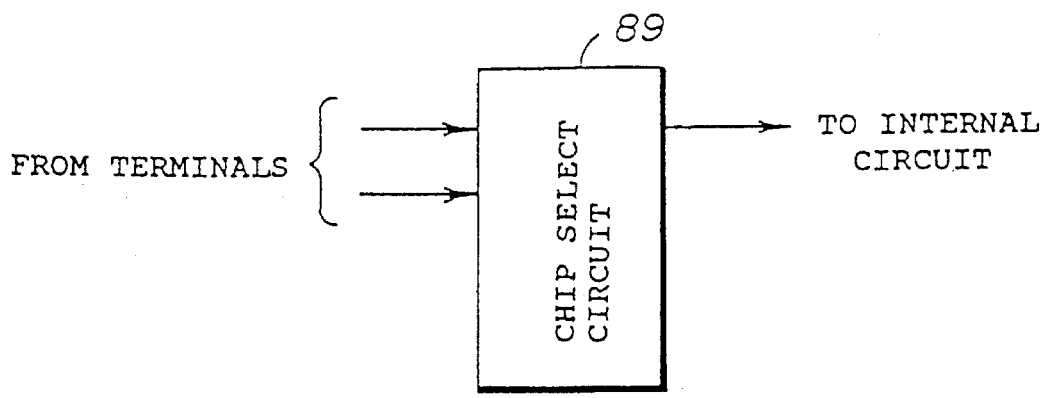
FIGS. 12A and 12B are diagrams of chip select circuits respectively provided in semiconductor chips of the semiconductor devices shown in FIG. 10 or FIGS. 11A and 11B.

In order to select one of the semiconductor chips, as shown in FIG. 12A, each of the semiconductor chips 62a, 62b, 64a and 64b has a chip select circuit 89, which is connected to two lead frames (chip select terminals) provided in common to the semiconductor chips 62a, 62b, 64a and 64b. The chip select circuit 89 receives a two-bit chip select circuit from an external circuit, and outputs to the internal circuit a signal indicating whether the internal circuit should be activated. For example, the semiconductor chip 52a is selected when the levels of both the bits are high.

Figure 12B:
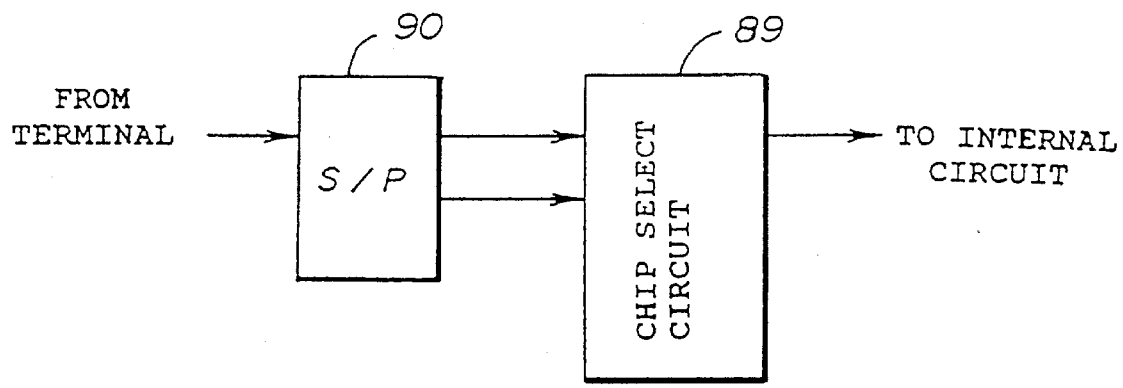

When the chip select signal is a serial signal of two bits, as shown in FIG. 12B, the chip select signal received via the chip select lead frame is converted into a two-bit parallel signal by a serial-to-parallel conversion circuit (S/P) 90, and then output to the chip select circuit 89.

When the semiconductor chips 52a, 52b, 54a and 54b have identical functions, it is preferable that the the semiconductor chips 52a and 52b have the mirror symmetry relationship and the semiconductor chips 54a and 54b have the mirror symmetry relationship. However, it is not necessarily required that the internal circuits of these semiconductor chips have the mirror symmetry relationship.

Another variation of the structure shown in FIG. 10 has five or more semiconductor chips within a single package. It would be obvious to those skill in the art to make variations and modifications.

Figure 13:
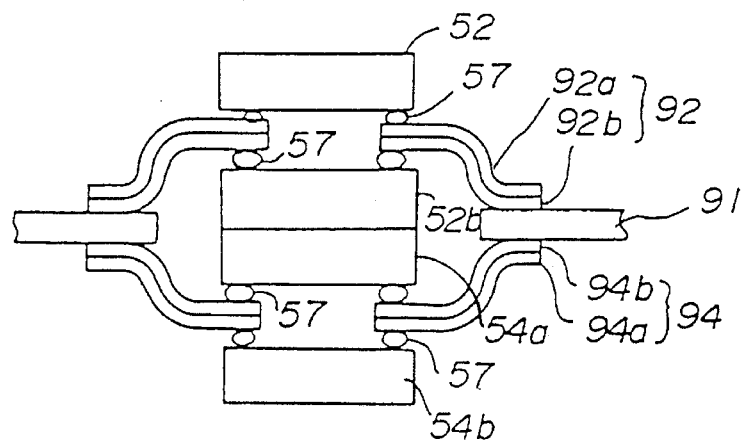
FIG. 13 is a cross-sectional view of a semiconductor device according to a fifth embodiment of the present invention.

FIG. 13 is a cross-sectional view of a fifth embodiment of the present invention. The main surface (chip face) of the semiconductor chip 52a in which the internal circuit is formed is opposed to that of the semiconductor chip 52b. Similarly, the chip face of the semiconductor chip 54a is opposed to that of the semiconductor chip 54b. The back surface of the semiconductor chip 52b is in contact with that of the semiconductor chip 54a. It is possible to fix the back surfaces of the semiconductor chips 52b and 54a to each other by an adhesive layer. Tape leads 92 are each composed of a first tape lead 92a and a second tape lead 92b, which are stacked and electrically connected to each other. The first tape leads 92a connect the terminals (bumps) 57 on the semiconductor chip 52 to the lead frames 91, and the second tape leads 92b connect the terminals 57 to the lead frames 91. Similarly, tape leads 94 are each composed of a first tape lead 94a and a second tape lead 94b, which are electrically connected to each other. The first tape leads 94a connect the terminals 57 on the semiconductor chip 54b to the lead frames 91, and the second tape leads 94b connect the terminal on the semiconductor chip 54a to the lead frames 91. The selection of the semiconductor chips 52a, 52b, 54a and 54b is made in the manner shown in FIG. 12A or FIG. 12B. It is preferable that the semiconductor chips 52a and 52b have the mirror symmetry relationship and the semiconductor chips 54a and 54b have the mirror symmetry relationship.

Figure 14A:
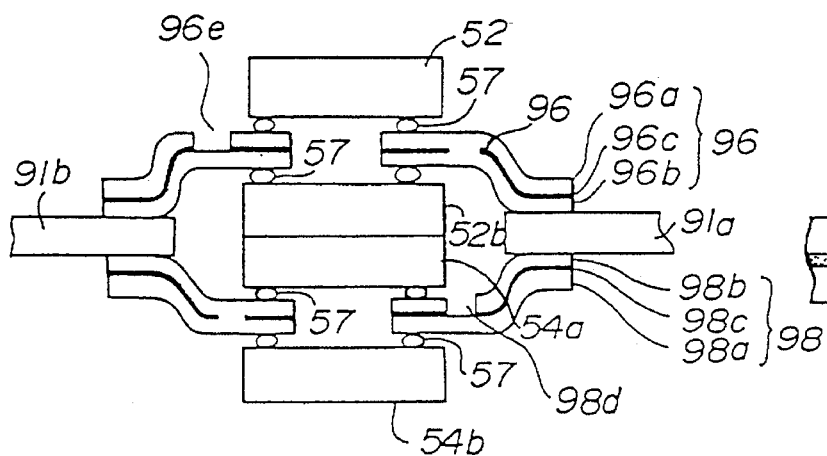
FIGS. 14A and 14B are cross-sectional views of a semiconductor device according to a sixth embodiment of the present invention.
Figure 14B:
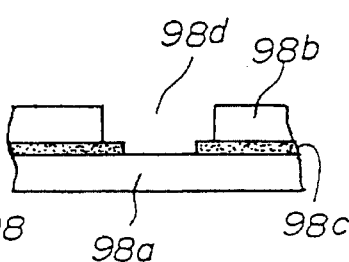

FIG. 14A is a cross-sectional view of a sixth embodiment of the present invention. The semiconductor chips 52a, 52b, 54a and 54b are oriented in the same direction as that in the structure shown in FIG. 13. In order to selectively activate the semiconductor chips 52a, 52b, 54a and 54b of the sixth embodiment, two lead frames, which are connected to these semiconductor chips via tape leads 96 and 98 are used. The tape lead 96 has a first tape lead 96a, a second tape lead 96b, and an insulating film 96c having a contact hole 96d. The insulating film 96c is provided between the first tape lead 96a and the second tape lead 96b. The first tape lead 96a and the second tape lead 96b are electrically connected to each other via the contact hole 96d. Similarly, the tape lead 98 is composed of first and second tape leads 98a and 98b, and an insulating film 98c having a contact hole 98c. As shown in FIG. 14B, it is possible to cut out the first tape lead 98a or the second tape lead 98b by means of a laser beam so that edge portions of the insulating layer appear through the contact hole. FIG. 14B shows that the second tape lead 98b has been cut off by the laser beam. In this manner, the second tape lead 98b is electrically disconnected from the first tape lead 98a.

In FIG. 14A, the tape lead 98b connecting the semiconductor chip 54a to the lead frame 91a (chip select terminal) and the tape lead connecting the semiconductor chip 52a to the lead frame 91b (chip select terminal) are cut off. The relationship between the two-bit chip select signal and the semiconductor chips 52a, 52b, 54a and 54b is as shown in Table 1.

TABLE 1

| Chip Select Signal | | |
|---|---|---|
| Lead 91a | Lead 91b | Selected chip |
| 1 | 0 | 52a |
| 1 | 1 | 52b |
| 0 | 0 | 54a |
| 0 | 1 | 54b |

Tape leads other than the two lead frames 91a and 91b which function as the chip select terminals can be formed with the tape leads 92 and 94 shown in FIG. 13. Of course, it is possible to form all the tape leads with the tape leads 96 and 98.

Figure 15:
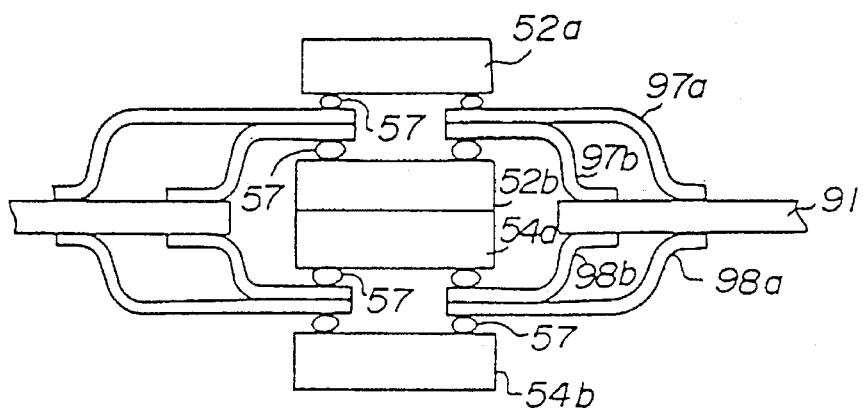
FIG. 15 is a cross-sectional view of a semiconductor device according to a seventh embodiment of the present invention.

FIG. 15 is a cross-sectional view of a seventh embodiment of the present invention. The semiconductor device shown in FIG. 15 is different from that shown in FIG. 13 in that tape leads are respectively bonded to lead frames at different positions of the lead frames. In the structure shown in FIG. 13, a tape lead 97a and a tape lead 97b are stacked and bonded together at one ends thereof, and bonded to the respective portions of the lead frame 91 at the other ends thereof. Similarly, a tape lead 98a and a tape lead 98b are stacked and bonded together at one ends thereof, and bonded to the respective portions of the lead frame 91 at the other ends thereof. The structure shown in FIG. 13 is formed so that the tape leads 92b and 94b are bonded to the lead frames 91 by using the bonding tool 43 shown in FIG. 9D, and then the tape leads 92a and 94a are bonded to the bonded tape leads 92b and 94b. It may be not desirable that the already bonded members be further thermocompressed. Further, a stepped part formed by the tape leads 92b and 94b may cause a problem during the second thermocompression procedure. The structure shown in FIG. 15 overcomes the above problems.

The structures of shown in FIGS. 13, 14A, 14B and 15 are sealed by molding at the respective final production steps. For the sake of simplicity, molded resin is omitted in FIGS. 13, 14A, 14B and 15.

Figure 8:
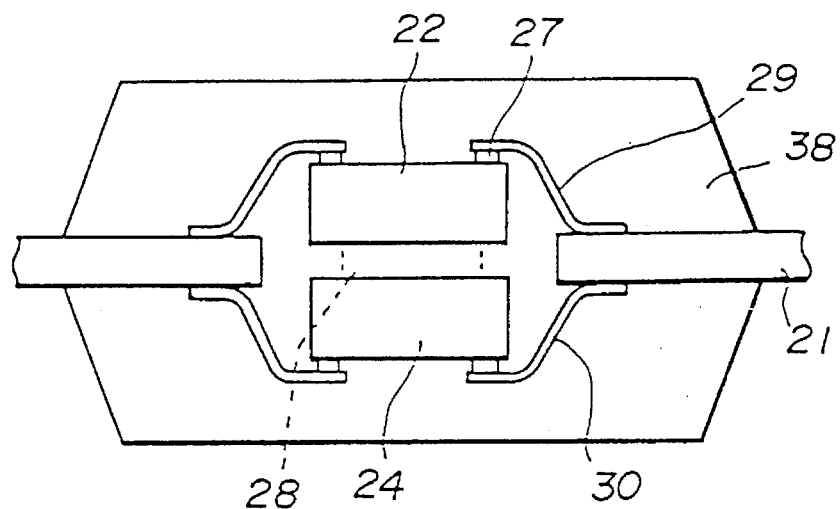
FIG. 8 is a cross-sectional view of the first embodiment of the present invention which is mold-sealed.
Figure 16:
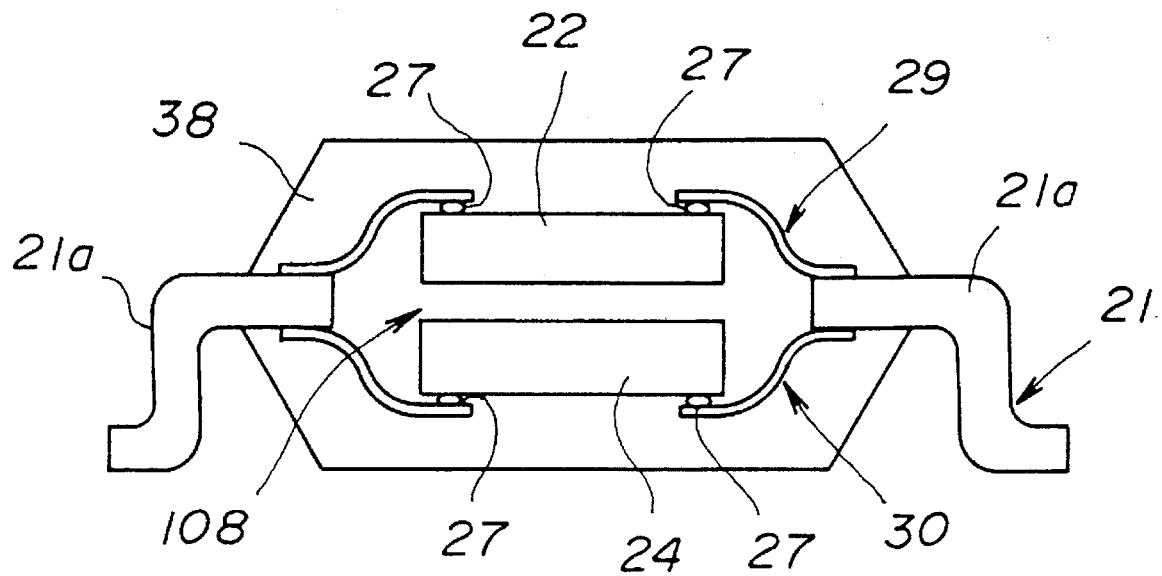
FIG. 16 is a cross-sectional view of a semiconductor device corresponding to a variation of the semiconductor device shown in FIG. 8.

FIG. 16 shows a variation of the semiconductor device shown in FIG. 8. In FIG. 22, parts that are the same as parts shown in FIG. 8 are given the same reference numbers. In the semiconductor device shown in FIG. 22, the adhesive layer 28 is used for bonding the semiconductor chips 22 and 24. The semiconductor device shown in FIG. 22 does not use the adhesive layer 28. That is, a space 108 is formed between the back surfaces of the semiconductor chips 22 and 24, and is filled with the mold resin 38. The space 108 is formed during the production step shown in FIG. 9D. The space 108 is equal to, for example, a few tens of micrometers. The mold resin 38 enters into the space 108 in the molding process. The mold resin 38 prevents entry of moisture into the space 108 between the back surfaces of the semiconductor chips 22 and 24 and prevents the occurrence of void and thermal stress. Further, the area of contact between the mold resin 38 and the semiconductor chips 22 and 24 is increased, and improved adhesion to the mold resin 38 can be obtained. This leads to an increase in reliability of the semiconductor device.

Figure 17:
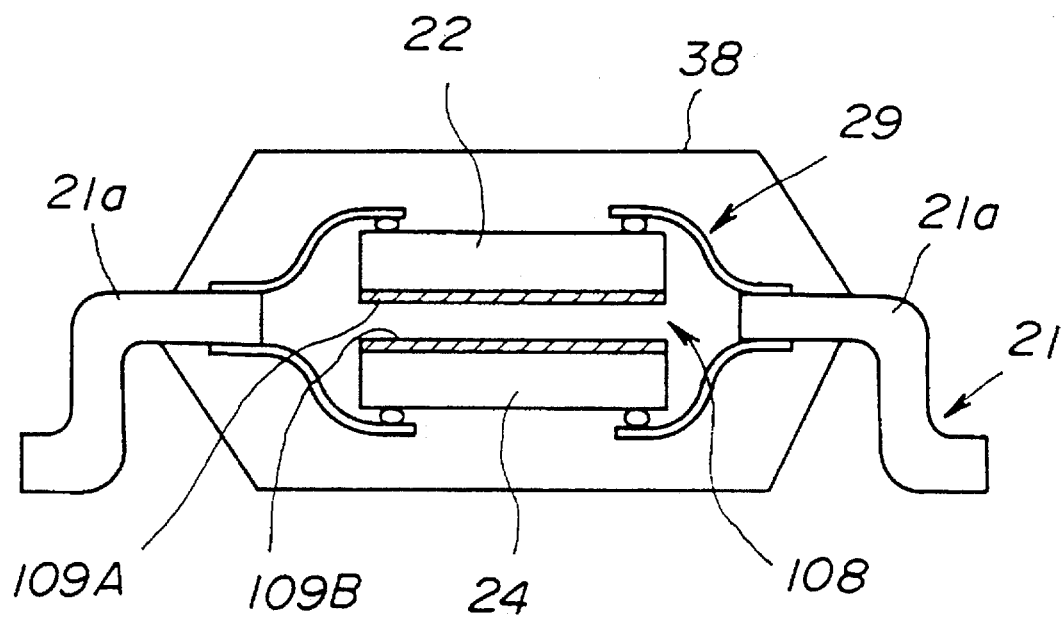
FIG. 17 is a cross-sectional view of a variation of the semiconductor device shown in FIG. 16.

FIG. 17 shows a variation of the semiconductor device shown in FIG. 16. In FIG. 17, parts that are the same as parts shown in FIG. 16 are given the same reference numbers. As shown in FIG. 17, nitride films 109A and 109B, such as silicon nitride films, are formed on the back surface of the semiconductor chips 22 and 24, respectively. The nitride films 109A and 109B can be formed by, for example, a plasma CVD, in which a nitrogen gas is supplied to the back surfaces of the semiconductor chips 22 and 24, and is excited by plasma discharge. The nitride films 109A and 109B further improve adhesion between the mold resin 38 and the back surfaces of the semiconductor chips 22 and 24. It is also possible to use an imide-system film (spin coat), a nitride oxide film or a silicon oxide film in lieu of the nitride film.

Figure 18:
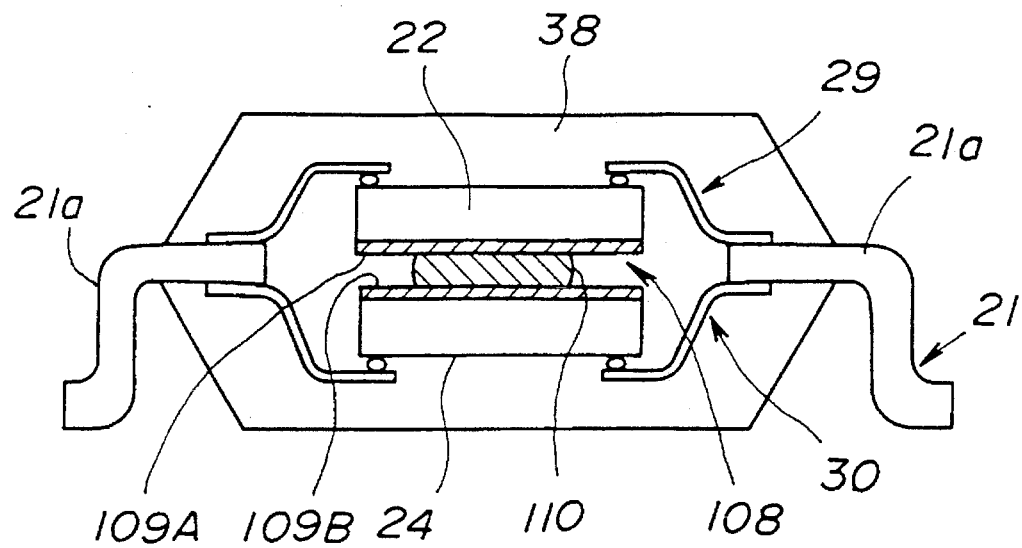
FIG. 18 is a cross-sectional view of a variation of the semiconductor device shown in FIG. 17.

FIG. 18 is a diagram of a variation of the semiconductor device shown in FIG. 17. In FIG. 18, parts that are the same as parts shown in FIG. 17 are given the same reference numbers. As shown in FIG. 18, a sticking agent member (adhesive member) 110 is provided between the nitride films 109A and 109B. The sticking agent member 110 functions to prevent the semiconductor chips 22 and 24 from moving during the resin molding process and thereby ensure the space 108. The sticking agent member 110 is in contact with a part of the nitride film 109A and a part of the nitride film 109B. That is, the nitride films 109A and 109B are partially opposite to each other without the sticking agent member 110. The mold resin 38 is filled with the space 108 between the semiconductor chips 22 and 24. The sticking agent member 110 can be an insulating or electrically conductive member. When the sticking agent member 110 having electrically conductive member is used, a ground system common to the semiconductor chips 22 and 24 can be established, and improved electric characteristics can be obtained.

Figure 19:
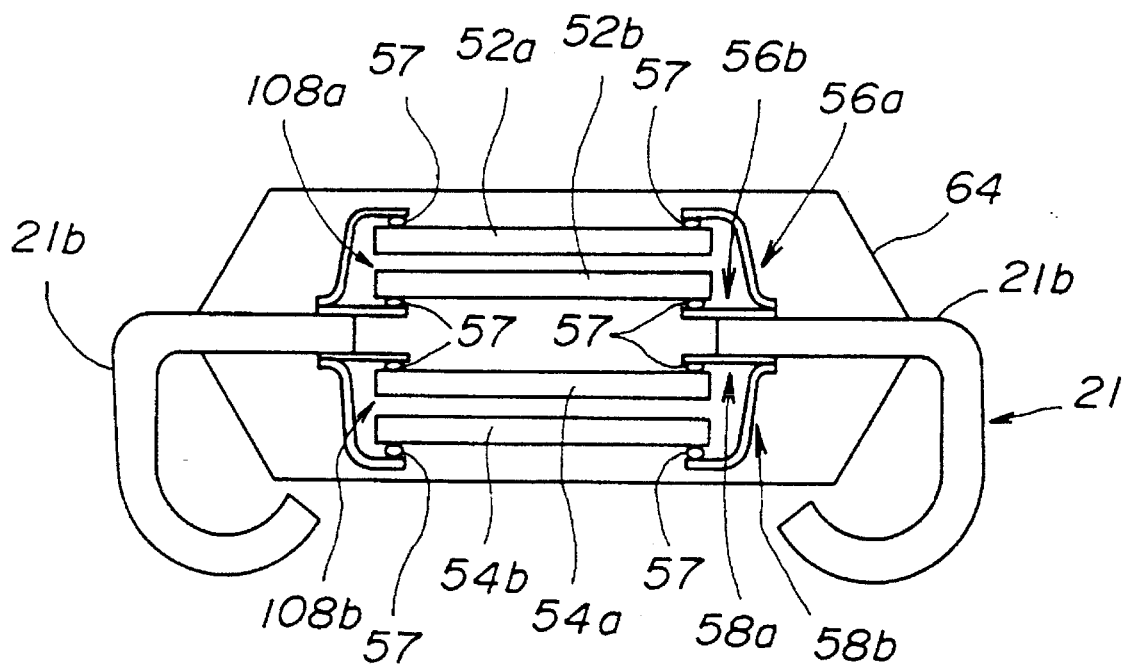
FIG. 19 is a cross-sectional view of a variation of the semiconductor device shown in FIG. 10.
Figure 20:
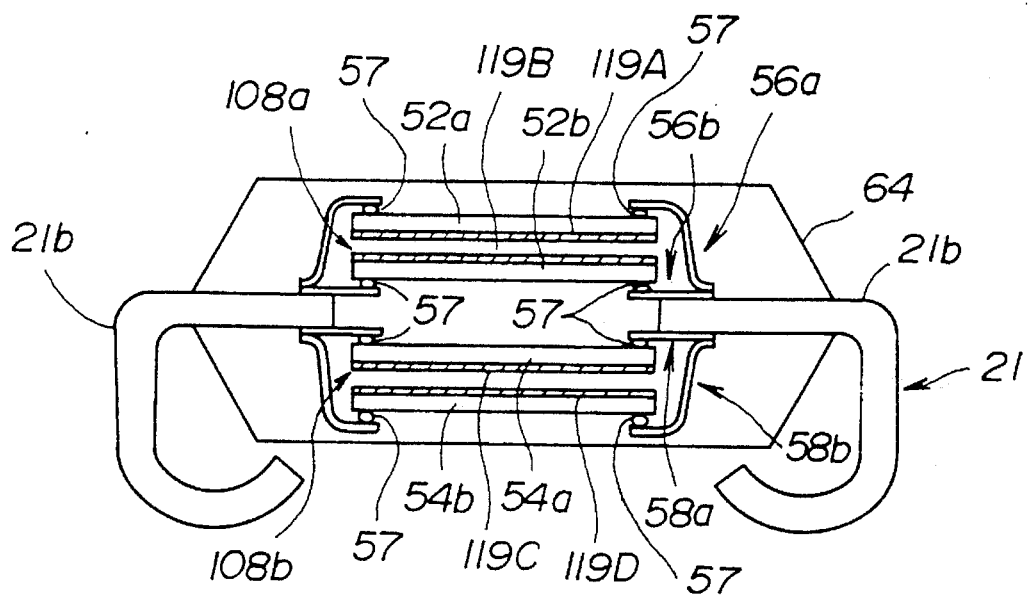
FIG. 20 is a cross-sectional view of a variation of the semiconductor device shown in FIG. 19.
Figure 21:
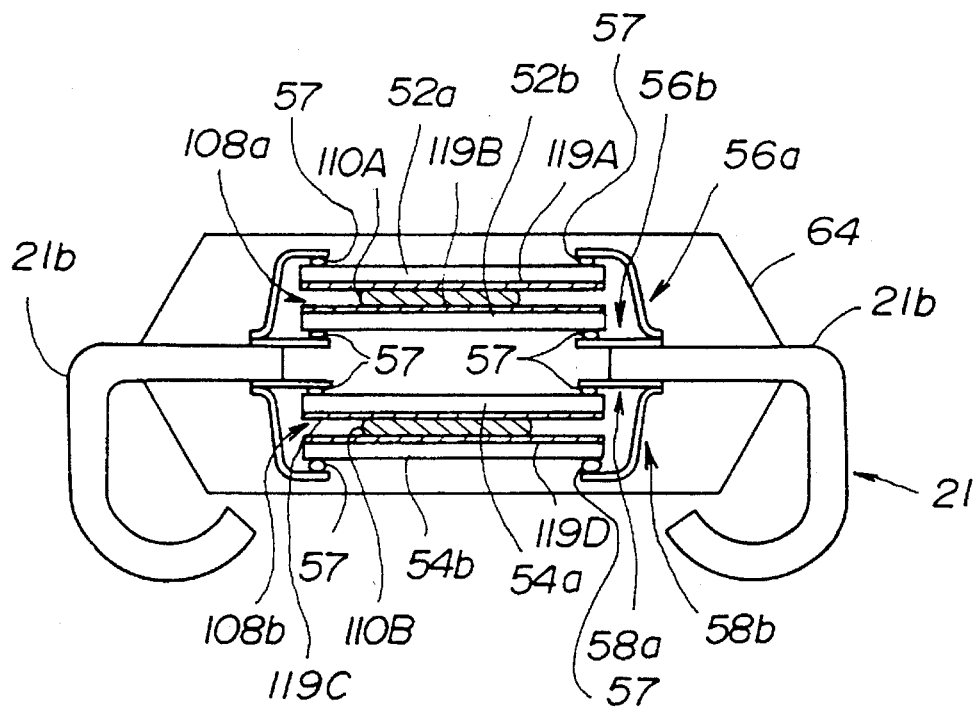
FIG. 21 is a cross-sectional view of a variation of the semiconductor device shown in FIG. 20.

FIG. 19 is a variation of the semiconductor device shown in FIG. 10. In FIG. 19, parts which are the same as parts shown in FIG. 10 are given the same reference numbers as previously. In lieu of the lead frames 60 and 62, the aforementioned lead frames 21 are used. In FIG. 19, outer leads 21b of the lead frames 21 are bent after resin molding so that they have J-shaped structures. The tape leads 56a and 56b are connected to the first surface of the lead frames 21, and the tape leads 58a and 58b are connected to the second surface of the lead frames 21. End portions of the tape leads 56a and 56b are stacked, and end portions of tape leads 58a and 58b are stacked. A space 108a is formed between the chips 52a and 52b, and a space 108b is formed between the chips 54a and 54b. The spaces 108a and 108b are filled with the mold resin 64. The mold resin 64 has the same functions as the mold resin 24 shown in FIG. 16. As shown in FIG. 20, it is possible to form nitride films 119A, 119B, 119C and 119D on the back surfaces of the semiconductor chips 52a, 52b, 54a and 54b in the same manner as shown in FIG. 17. Further, as shown in FIG. 21, it is possible to provide sticking agent members (adhesive members) 110A and 110B between the opposite nitride films.

As has been described above, according to present invention, it becomes possible to arrange a plurality of semiconductor chips in an identical area and hence increase the integration density and capacity.

The present invention is applied to, for example, a memory in an IC card.

What is claimed is:

1. A semiconductor device comprising:

two lead frame parts each having a first main surface and a second main surface opposite to each other, bonding being able to be performed on the first and second main surfaces the lead frame parts dividing the semiconductor device into a first main surface side and a second main surface side, the first and second main surface sides corresponding respectively to the first and second main surfaces of the lead frame parts;

a first semiconductor chip arranged on the first main surface side;

first tape leads electrically connecting the first main surfaces of the lead frame parts to the first semiconductor chip;

a second semiconductor chip arranged on the second main surface side;

second tape leads electrically connecting the second main surface of the lead frame parts to the second semiconductor chip so that, with the first and second tape leads, each of the two lead frame parts is connected to both the first and second semiconductor chips;

a mold resin molding the first and second semiconductor chips, wherein:

the first semiconductor chip has a first surface including an internal circuit, and a second surface opposite to the first surface, the second semiconductor chip has a first surface including an internal circuit, and a second surface opposite to the first surface of the second semiconductor chip, the second surface of the first semiconductor chip is opposed to the second surface of the second semiconductor chip, and said mold resin is provided in a space between the second surfaces of the first and second semiconductor chips; and first and second films respectively formed substantially only on the second surfaces of the first and second semiconductor chips, said first and second films functioning to improve adhesion between the mold resin and the first and second semiconductor chips.

2. A semiconductor device as claimed in claim 1, further comprising a member provided between the first and second films respectively formed on the second surfaces of the first and second semiconductor chips, said member positioning the first and second semiconductor devices so that the first and second films respectively formed on the second surfaces of the first and second semiconductor chips are spaced apart from each other.

3. A semiconductor device as claimed in claim 1, wherein said first and second films respectively comprise silicon nitride.

4. A semiconductor device comprising:

first and second semiconductor chips forming a first pair;

third and fourth semiconductor chips forming a second pair;

a plurality of lead frame parts, each having first and second main surfaces, the first and second pairs being located on respective sides of the lead frame parts so that the first and second pairs are opposite to each other;

first tape leads electrically connecting the first main surfaces of the lead frame parts to the first semiconductor chip;

second tape lead electrically connecting the first main surfaces of the lead frame parts to the second semiconductor chip;

third tape leads electrically connecting the second main surfaces of the lead frame parts to the third semiconductor chip;

fourth tape leads electrically connecting the second main surfaces of the lead frame parts to the fourth semiconductor chip; and a mold resin molding the first, second, third and fourth semiconductor chips, wherein the mold resin is provided in a first space between the first and second semiconductor chips and a second space between the third and fourth semiconductor chips.

5. A semiconductor device as claimed in claim 4, further comprising:

a first film formed on a back surface of the first semiconductor chip;

a second film formed on a back surface of the second semiconductor chip, said first and second films being spaced apart from each other;

a third film formed on a back surface of the third semiconductor chip; and a fourth film formed on a back surface of the fourth semiconductor chip, said third and fourth films being spaced apart from each other, wherein the first, second, third and fourth films function to improve adhesion between the mold resin and the first, second, third and fourth semiconductor chips.

6. A semiconductor device as claimed in claim 5, further comprising:

a first member provided between the first and second films; and a second member provided between the third and fourth films, wherein the first member positions the first and second semiconductor chips so that they are spaced apart from each other; and the second member positions the third and fourth semiconductor chips so that they are spaced apart from each other.

7. A semiconductor device as claimed in claim 5, wherein the first, second, third and fourth films respectively comprise silicon nitride.

* * * * *

UNITED STATES PATENT AND TRADEMARK OFFICE
CERTIFICATE OF CORRECTION

PATENT NO. : 5,530,292
DATED : June 25, 1996
INVENTOR(S) : Masaki WAKI et al.

It is certified that error appears in the above-indentified patent and that said Letters Patent is hereby corrected as shown below:

<u>Col. 14</u>, line 4, change "molding" to --encapsulating--;

line 6, after "wherein" insert --:-- and begin new paragraph before "the";

line 9, change "." to --, and--, and insert as a new paragraph --the first and second main surfaces of the lead frame parts being continuous and extending out of the mold resin.--

Signed and Sealed this

Fifteenth Day of October, 1996

Attest:

BRUCE LEHMAN

*Attesting Officer*          *Commissioner of Patents and Trademarks*